United States Patent [19]

Klein

[11] Patent Number: 5,072,077

[45] Date of Patent: Dec. 10, 1991

[54] MONOLITHIC MEMBRANE SWITCH

[76] Inventor: Harold Klein, 17818 North 134th Ave., Sun City West, Ariz. 85375

[21] Appl. No.: 659,605

[22] Filed: Feb. 21, 1991

[51] Int. Cl.[5] ........................ H01H 13/70; H05K 1/00

[52] U.S. Cl. .................................... 200/5 A; 200/512; 200/292; 361/398

[58] Field of Search ........................ 200/5 A, 512-517, 200/292, 308, 317; 174/250, 261, 268; 361/398

[56] References Cited

U.S. PATENT DOCUMENTS

| | | | |
|---|---|---|---|
| 3,987,259 | 10/1976 | Larson | 200/5 A |
| 4,303,811 | 12/1981 | Parkinson | 200/5 A |
| 4,375,018 | 2/1983 | Petersen | 200/5 A |
| 4,510,353 | 4/1985 | Nemitz | 200/5 A |
| 4,845,323 | 7/1989 | Beggs | 200/85 R |
| 4,990,724 | 2/1991 | Suppelsa et al. | 174/261 |

*Primary Examiner*—J. R. Scott

*Attorney, Agent, or Firm*—Poms, Smith, Lande & Rose

[57] ABSTRACT

A membrane has strips of membrane material attached at their first end to an upper surface of the lower membrane layer. The strips stay flush with the upper surface when the electrically conductive material is patterned thereon such that material is contiguous along the strips and the upper surface. Adjacent the first end of the strips is a hole cut through the lower membrane layer. After the material is patterned and the hole is cut, the second end of the strip is peeled from the upper and rounded through the hole with the strip being folded back over itself. The second end of the strip may then extend externally of the membrane switch for connection to a switchable device.

12 Claims, 2 Drawing Sheets

MONOLITHIC MEMBRANE SWITCH

FIELD OF THE INVENTION

The present invention relates generally to electrical switches and more particularly to a touch activated membrane switch.

BACKGROUND OF THE INVENTION

Touch activated membrane switches have become very common place for use in industrial equipment controls, home appliances and office equipment. The advantages membrane switches exhibit over mechanical electrical switches are numerous. For example, membrane switches are not prone to mechanical failure modes, such as breakage of moving parts, which are present in conventional mechanical switches. Furthermore, membrane switches present a more ergonomic human/machine interface and are also more aesthetically pleasing to the eye.

A typical membrane switch includes a lower membrane layer, an insulative spacer layer and an upper membrane layer. An upper face of the lower membrane layer is patterned with electrically conductive material to form at least a first electrode member and a second electrode member. Typically, the membrane switch includes an array of switches such that the electrically conductive material forms a plurality of pairs of first and second electrode members. Each pair of the first and second electrode members is used to complete separate conductive paths. The array of pairs is disposed in two dimensional array across the upper face of the lower membrane layer.

The insulative spacer layer is mounted to the upper face of the lower membrane layer. The spacer layer has an opening therethrough exposed over each pair of first and second electrode members. The upper membrane layer is mounted on the insulative spacer layer. A lower face of upper membrane layer has an electrically conductive shunt formed thereon over each of the opening of the spacer layer. Depression of the upper layer at each shunt completes an electrical circuit between the first electrode member and the second electrode member immediately below the selected shunt.

Typically, the lower layer is mounted on a substrate and a graphics layer is disposed on the upper membrane layer. The graphics layer includes indicia whereat depression of the graphics layer is to occur. The indicia are in alignment with the shunts on the upper membrane layer, and hence, the openings through the insulative spacial layer.

To make connection with to a device to be switched, the conductive material on the lower layer is extended to the periphery of such layer. The membrane switch as described above is then placed in a package. The package has external leads to connect to the various devices. The conductive material at the periphery of the lower layer is in electrical communication with the external leads by means of being connected internally within the switch package. The bonding of the conductive material to the leads of the package thus requires an additional fabrication step. It would be desirable to eliminate this fabrication step in which the external leads must be bonded to the conductive material.

SUMMARY OF THE INVENTION

It is an object of the present invention to provide a membrane switch in which the external leads are provided for during the assembly of the switch. It is another object of the present invention to provide a membrane switch wherein the external leads are extended directly from the lower membrane layer. It is a further object of the present invention to provide a three dimensional array of pairs of first and second electrode members within a monolithic membrane switch.

According to the present invention, membrane material strips extend from the lower membrane layer. Each of the strips has electrically conductive material thereon in communication with a respective one of the first electrode members or the second electrode members. The strips are placed through openings in the lower membrane layer and extend between the lower layer and the substrate layer and may further extend externally of the membrane switch. The free ends of the strips external of the switch may then be attached directly to a switchable device.

In another aspect of the present invention, several layers of switches may be fabricated by the use of multiple stack membrane layers, each with pairs of first and second electrodes. Connection may be made to vertically stack switches by the strips extending through openings within the various membrane layers.

These and other objects, features and advantages of the present invention will become readily apparent to those skilled in the art from a study of the following Description of an Exemplary Preferred Embodiment when read in conjunction with the attached Drawing and appended claims.

DESCRIPTION OF AN EXEMPLARY PREFERRED EMBODIMENT

Figure 1:
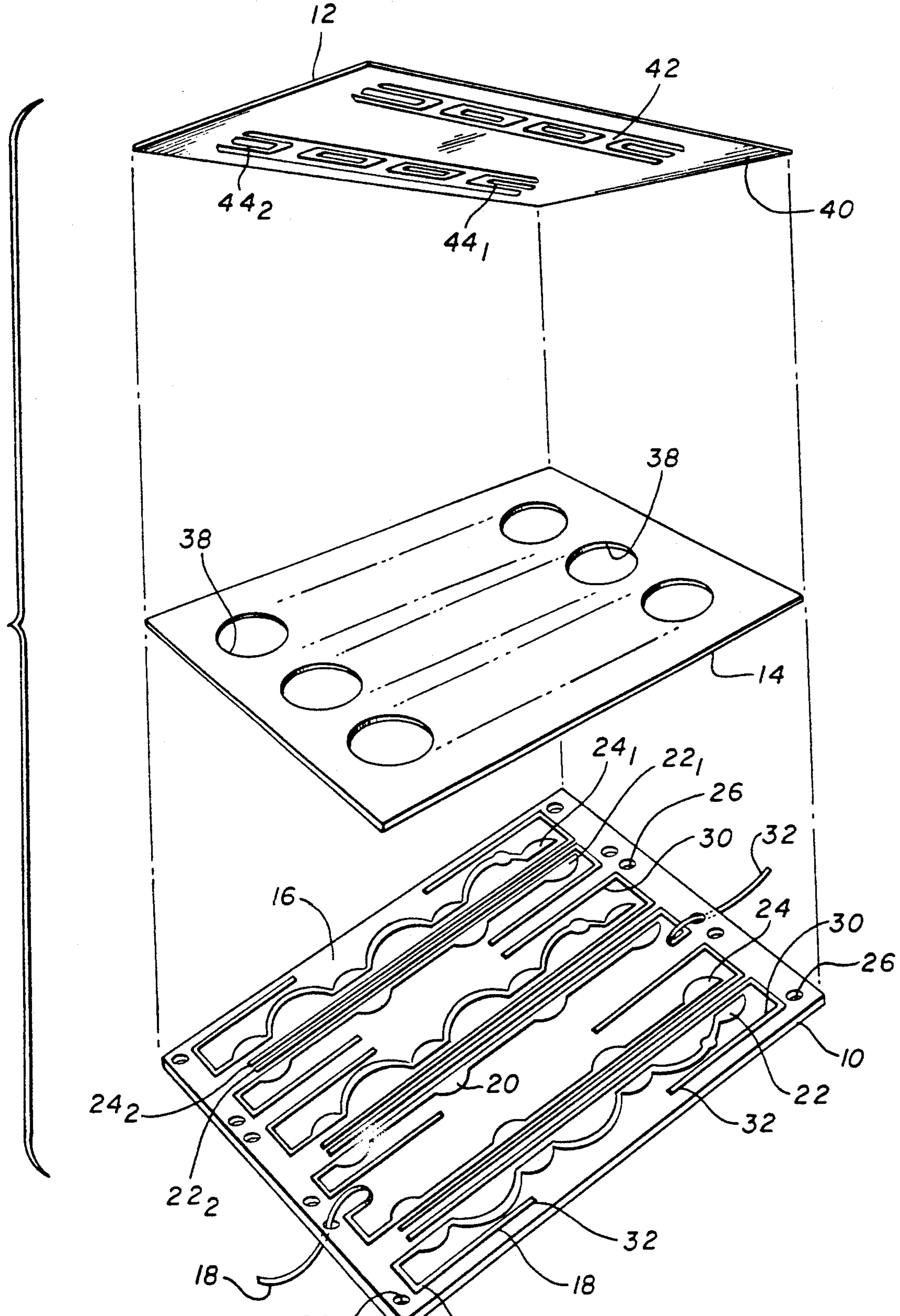
FIG. 1 is an exploded view showing the lower membrane layer, the insulative spacer layer and the upper membrane layer wherein the membrane strips are attached the upper face of the lower membrane layer in accordance with the principals of the present invention.

Referring to FIG. 1, there is shown a first, lower membrane layer 10, a second, upper membrane layer 12 and an insulative spacer layer 14. The spacer layer 14 is disposed intermediate the lower layer 10 and the upper layer 12. Attached to an upper face 16 of the lower layer 10 are a plurality of membrane strips 18 constructed in accordance with the principals of the present invention which is described in greater detail immediately hereinbelow.

The upper face 16 of the lower layer 10 is patterned with electrically conductive material 20 to form a first electrode member 22 and a second electrode member 24. As best seen in FIG. 1, the conductive material 20 can form several pairs of first electrode members 22 and second electrode members 24. For example, a first pair is formed by first electrode member $\mathbf{22}_1$ and second electrode member $\mathbf{24}_1$ and a second pair is formed by first electrode member $\mathbf{22}_2$ and second electrode member $\mathbf{24}_2$.

The lower layer 10 further includes a plurality of openings 26. Each of the openings 26 extend between the upper face 16 and a lower face 28 of the lower layer 10. Each of the openings 26 is disposed near a first end 30 of a respective one of the strips 18. A second end 32 of each of the strips 18 is then threaded through the opening 26 therethrough for reasons which will become readily apparent from the following description.

Each of the strips 18 also have the electrically conductive material 20 disposed thereon. The material 20 on the strips 18 is in electrical communication with one of the first electrode members 22 and second electrode members 24, as best seen in FIG. 1.

The insulative spacer layer 14 is disposed intermediately the lower layer 10 and the upper layer 12. The spacer layer 14 includes a plurality of openings 38 therethrough. Each of the openings 38 are disposed over a respective one of a pair of first electrode members 22 and second electrode members 24.

Figure 2:
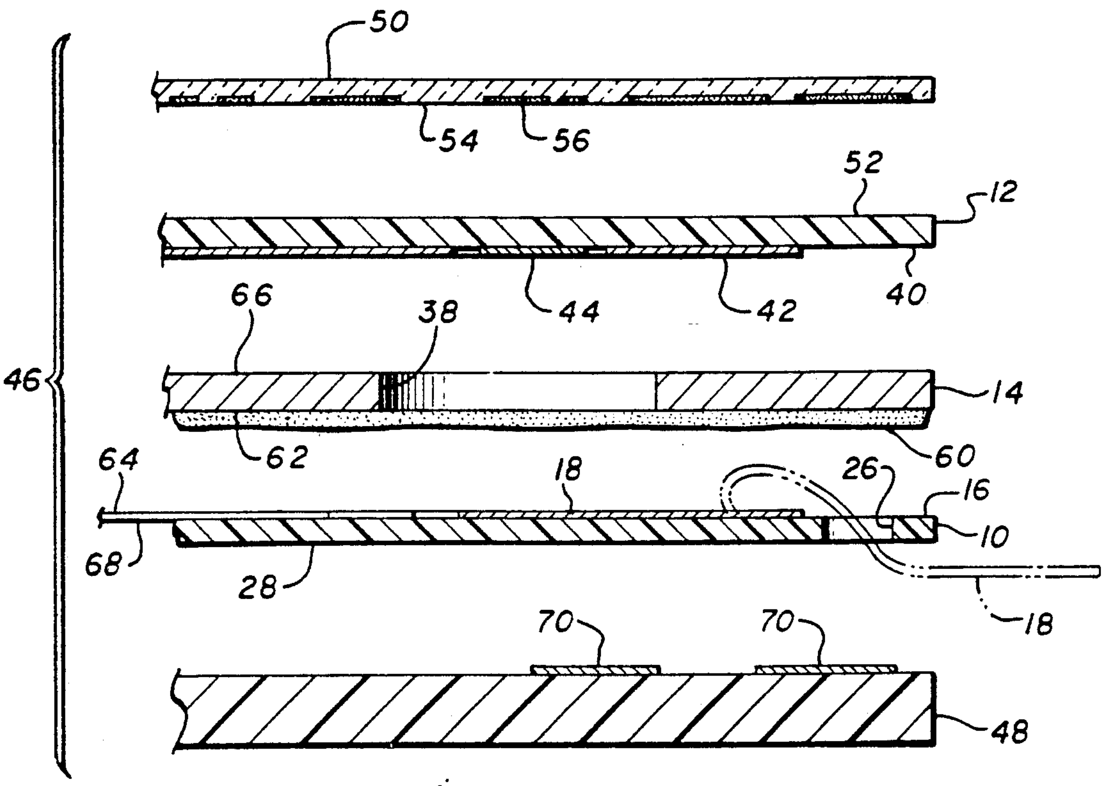
FIG. 2 is an exploded cross-sectional view of the membrane switch of the present invention showing the addition of the substrate layer and graphics layer to the view of FIG. 1.

FIG. 2 also shows a layer of insulative epoxy 60 disposed on the back side 62 of the spacer layer 14 facing the front side 64 of the lower membrane layer 10. The insulative epoxy layer 60 prevents the strips 18 from pulling away from the lower membrane layer 10. The epoxy layer 60 further prevents the strip 18 from shorting out when the strips 18 are folded over. Therefore, the epoxy layer 60 acts as both a bonding agent and an insulative agent. FIG. 2 also shows the front side 66 of the spacer layer 14 and the back side 68 of the lower membrane layer.

The upper layer 12 has a lower surface 40 in facing relationship to the insulative spacer layer 14. On the lower surface 40 of the upper layer 12 is patterned electrically conductive material 42 to form a plurality of shunts 44. Each of the shunts 44 are disposed in alignment with one of the openings 38 of the spacer layer 14. Furthermore, each of the shunts 44 is disposed in alignment with a respective one of the pairs of first electrode members 42 and second electrode members 24. For example, shunt $44_1$ is disposed in alignment with the first electrode member $22_1$ and second electrode member $24_1$. Similarly, the shunt $44_2$ is aligned with the first electrode member $22_2$ and second electrode member $24_2$. Upon depression of the membrane switch, the shunt 44 shorts the respective first electrode member 22 and second electrode 24 to each other to complete and electrical circuit, as is well known in the art of membrane switches.

To fabricate the membrane switch, the strips 18 are formed from membrane material approximately 1/10th the thickness of the membrane material used for each of the lower layer 10 and upper layer 12. Each of the strips 18 are then attached at their first end 30 by known bonding techniques to the upper surface 16 of the lower layer 10. With the strips 18 laid flush on the upper surface 16 of the lower layer 10, the electrically conductive material 20 is then conventionally silk screened thereon to form the patterning. The patterned conductive material is contiguous on both the upper surface 6 and the strips 18 at this step of the process. The strips 18 are disposed flush with the upper surface 16 for the silk screen process. Subsequent to the patterning of the electrically conductive material 20, the openings 26 are formed. The strips 18 with the conductive material thereon are then peeled from the surface 16 so that the second ends 32 thereof are threaded through the openings 26 as best seen in FIG. 1. The second end 32 of the strips 18 are removed from the upper surface such that the strip 18 is folded over itself. FIG. 2 also shows the patterned electrically conducting material 70 on the substrate 48.

Figure 3:
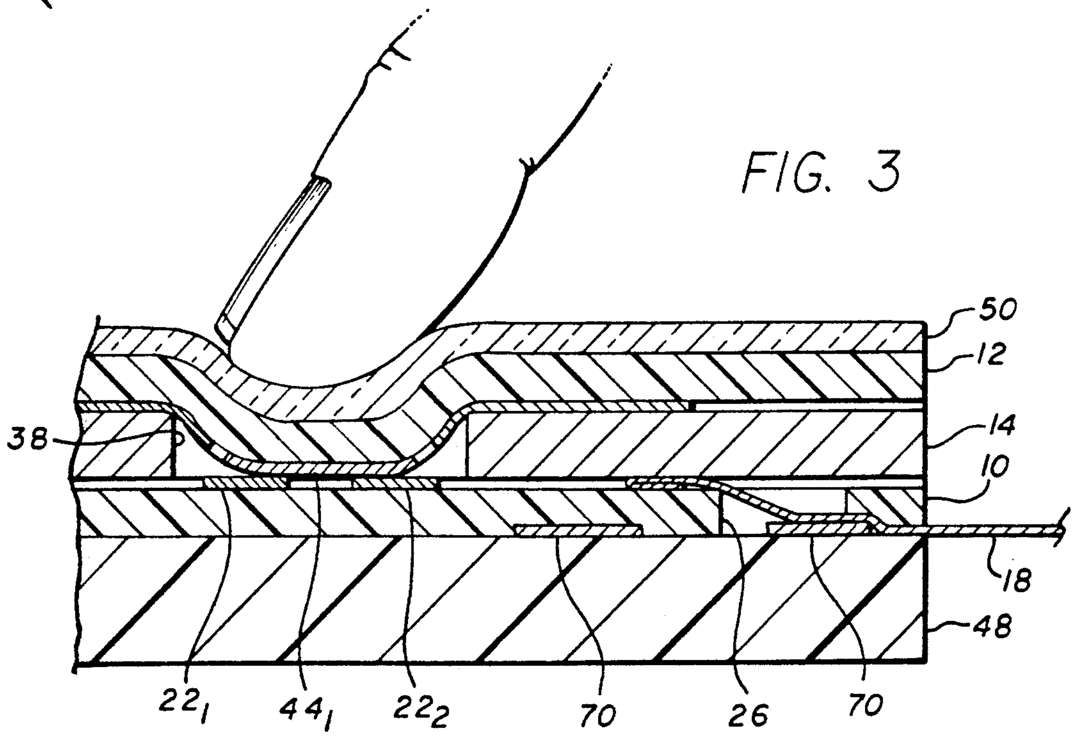
FIG. 3 is a cross-sectional view of the assembled membrane switch instructed in accordance with the principals of the present invention.

With further reference to FIG. 2, as is shown in an exploded view of fragmentary cross-sectional portion of a membrane switch 46 constructed to strips 18 on the lower layer 10 as described hereinabove. After the strips 18 are threaded through a respective one of the openings 26, the lower layer 10 is bonded to a substrate 48, such that the strips 18 extend between the lower sub-face 28 and the substrate 48. The spacer layer 14 may then be bonded to the upper surface 16 of the lower layer 10. Similarly, the upper membrane layer 12 is then bonded to the spacer layer 14. A graphics layer 50 is then bonded to an upper surface 52 of the second layer 12. A lower surface 54 of the graphics layer 50 carries indicia 56. Each of the indicia 56 are aligned with a respective one of the openings 38 in the spacer layer 14. The indicia 56 provides an indication where a membrane switch is to be depressed as best seen in FIG. 3. Upon depression of the switch seen in FIG. 3, the shunt 44 completes the electrical surface between the first electrode member and second electrode member 24. The conductive material 20 on the strip 18 then carries current to a device to which it may be connected.

The strips 18 extend externally of the switch 46 so that they may be readily connected to any device which utilizes the switching element. In this embodiment, the strips 18 function as wires extending from the switch 46 which are easily connected to any device. Alternatively, the several membrane layers, similar to first layer 10, may be constructed and stacked within the switch 46 to provide interconnection between multi-layer of switching elements.

In an alternative embodiment, the membrane switch may be formed directly onto the surface of the equipment the switch controls. Therefore, the switch would not require a substrate layer 48, because the equipment surface serves as the substrate layer.

There has been described hereinabove a novel monolithic membrane switch constructed according to the principals of the present invention as described hereinabove. Those skilled in the art may now make numerous uses of and departures from the above described embodiments without departing from the inventive concepts which are defined solely by the scope of the following claims.

I claim:

1. In a membrane switch wherein said switch has a substrate layer, a first membrane layer disposed on said substrate layer, an insulator layer disposed on said first membrane layer, a second membrane layer disposed on said insulator layer and a graphics layer disposed on said second membrane layer, a method comprising the steps of:

- attaching a first end of a plurality of membrane strips on an upper surface of said first membrane layer;
- patterning electrically conductive material contiguously on said upper surface and each of said strips;
- forming openings in said first layer adjacent each first end of said strips; and
- peeling said strips from a second end thereof away from said upper surface of said first membrane layer and extending said second end of .each of said strips through a respective one of each of said openings adjacent thereto so that said strips are disposed between said first layer and said substrate and extend externally of said switch.

2. A membrane switch comprising;

a substrate layer;

a first membrane layer disposed on said substrate layer, said first membrane layer having an upper surface layer, a lower surface, at least one opening disposed therethrough, and patterned electrically conductive material disposed on said upper surface, said lower surface being in a facing relationship to said substrate;

a membrane strip having a first end and a second end, a front side and a back side; said first end being attached to said upper surface, said strip having electrically conductive material thereon and electrical communication with said first membrane patterned material, said strip being disposed through said opening such that said second end extends between said substrate and said first layer;

an insulative spacer layer, having a front side and a back side, disposed on said upper surface, said spacer layer having an opening therethrough, said conductive material on said upper surface having a first electrode member and a second electrode member exposed by said opening in said spacer layer, said first electrode member and said second electrode member being electrically insulated from each other;

a second membrane layer disposed on said spacer layer, said second layer having an upper surface, a lower surface in a facing relationship to said spacer layer and at least one electrically conductive shunt on said lower layer, said shunt being disposed adjacent said opening of said spacer layer; and a graphics layer disposed on said upper surface of said second membrane layer, said graphics layer having indicia thereon overlaying said opening of said spacer layer so that depressing a graphics layer at said indicia brings said shunt into electrical contact with said first electrode member and said second electrode member to complete an electrical circuit wherein said circuit includes said conducting material on said strip.

3. A membrane switch as set forth in claim 2 wherein said strip has thickness substantially less than a thickness of said first membrane layer.

4. A membrane switch as set forth in claim 3 wherein the thickness of said strip is 1/10th the thickness of said first membrane layer.

5. A membrane switch as set forth in claim 2 wherein said substrate layer includes patterned electrically conductive material thereon, said material on said strip further being in electrical contact with said patterned electrically conductive material on said substrate.

6. A membrane switch as set forth in claim 2 wherein said strip extends externally of said switch for connection to an electrically switchable device.

7. A membrane switch as set forth in claim 2 further comprising an insulative epoxy layer disposed on said back side facing of said insulative spacer layer facing said front front side of said membrane strip.

8. A membrane switch comprising:

a first membrane layer, said first membrane layer having an upper surface layer, a lower surface, at least one opening disposed therethrough, and patterned electrically conductive material disposed on said upper surface;

a membrane strip having a first end and a second end, a front side and a back side; said first end being attached to said upper surface, said strip having electrically conductive material thereon and electrical communication with said to first membrane patterned material, said strip being disposed through said opening such that said second end extends below said first layer;

an insulative spacer layer, having a front side and a back side, disposed on said upper surface, said spacer layer having an opening therethrough, said conductive material on said upper surface having a first electrode member and a second electrode member exposed by said opening in said spacer layer, said first electrode member and said second electrode member being electrically insulated from each other;

a second membrane layer disposed on said spacer layer, said layer having an upper surface, a lower surface in a facing relationship to said spacer layer and at least one electrically conductive shunt on said lower layer, said shunt being disposed adjacent said opening of said spacer layer; and a graphics layer disposed on said upper surface of said second membrane layer, said graphics layer having indicia thereon overlaying said opening of said spacer layer so that depressing a graphics layer at said indicia brings said shunt into electrical contact with said first electrode member and said second electrode member to complete an electrical circuit wherein said circuit includes said conducting material on said strip.

9. A membrane switch as set forth in claim 8 wherein said strip has thickness substantially less than a thickness of said first membrane layer.

10. A membrane switch as set forth in claim 9 wherein the thickness of said strip is 1/10th the thickness of said first membrane layer.

11. A membrane switch as set forth in claim 8 wherein said strip extends externally of said switch for connection to an electrically switchable device.

12. A membrane switch as set forth in claim 8 further comprising an insulative epoxy layer disposed on said back side of said insulative spacer layer facing said front side of said membrane strip.

* * * * *